(12) United States Patent
Ito et al.

(10) Patent No.: US 10,547,276 B2
(45) Date of Patent: Jan. 28, 2020

(54) POWER AMPLIFIER CIRCUIT

(71) Applicant: Murata Manufacturing Co., Ltd., Kyoto (JP)

(72) Inventors: Masahiro Ito, Kyoto (JP); Tsuyoshi Sato, Kyoto (JP); Kiichiro Takenaka, Kyoto (JP); Hidetoshi Matsumoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/111,797

(22) Filed: Aug. 24, 2018

(65) Prior Publication Data

US 2019/0068129 A1 Feb. 28, 2019

(30) Foreign Application Priority Data

Aug. 25, 2017 (JP) .................. 2017-162632

(51) Int. Cl.
| | |
|---|---|
| *H03F 3/68* | (2006.01) |
| *H03F 1/26* | (2006.01) |
| *H03F 1/02* | (2006.01) |
| *H03F 3/24* | (2006.01) |
| *H03F 3/19* | (2006.01) |

(52) U.S. Cl.
CPC ............ *H03F 1/26* (2013.01); *H03F 1/0288* (2013.01); *H03F 3/19* (2013.01); *H03F 3/245* (2013.01); *H03F 2200/165* (2013.01); *H03F 2200/21* (2013.01); *H03F 2200/372* (2013.01); *H03F 2200/451* (2013.01)

(58) Field of Classification Search
CPC .................. H03F 1/0288; H03F 3/68
USPC .............................. 330/124 R, 295
See application file for complete search history.

(56) References Cited

U.S. PATENT DOCUMENTS

| | | |
|---|---|---|
| 2014/0120854 A1 | 5/2014 | Briffa et al. |
| 2016/0241209 A1 | 8/2016 | Lehtola |
| 2019/0140598 A1* | 5/2019 | Schultz ............... H01L 29/2003 |

FOREIGN PATENT DOCUMENTS

| | | |
|---|---|---|
| JP | 2011-101111 A | 5/2011 |
| JP | 2015-533065 A | 11/2015 |

\* cited by examiner

*Primary Examiner* — Steven J Mottola
(74) *Attorney, Agent, or Firm* — Pearne & Gordon LLP

(57) ABSTRACT

A power amplifier circuit includes a Doherty amplifier including a divider that divides a first signal into a second signal and a third signal, a carrier amplifier that amplifies the second signal and outputs a fourth signal, a peak amplifier that amplifies the third signal and outputs a fifth signal, a combiner that combines the fourth signal and the fifth signal and outputs an amplified signal of the first signal, a first bias circuit that supplies a first bias current or voltage to the carrier amplifier, and a second bias circuit that supplies a second bias current or voltage corresponding to a control signal to the peak amplifier; and a control circuit that supplies the control signal corresponding to a level of the second signal to the second bias circuit. The control circuit includes a detecting unit, an output unit, and a filter circuit.

11 Claims, 7 Drawing Sheets

POWER AMPLIFIER CIRCUIT

This application claims priority from Japanese Patent Application No 2017-162632 filed on Aug. 25, 2017. The content of this application is incorporated herein by reference in its entirety.

BACKGROUND

The present disclosure relates to a power amplifier circuit. Doherty amplifiers are available as high-efficiency power amplifier circuits. A Doherty amplifier typically has a configuration in which a carrier amplifier and a peak amplifier are connected in parallel to each other. The carrier amplifier operates regardless of the power level of an input signal. The peak amplifier is turned off when the power level of the input signal is small and is turned on when the power level of the input signal is large. In this configuration, when the power level of the input signal is large, the carrier amplifier operates while maintaining saturation at a saturation output power level. Accordingly, the Doherty amplifier achieves increased efficiency compared with an ordinary power amplifier circuit.

As a modification of such a Doherty amplifier, for example, U.S. Patent Application Publication No. 2016/0241209 discloses a configuration of detecting a saturation state of a carrier amplifier by using a base current of the carrier amplifier and controlling a bias current of a peak amplifier by using a detection signal. In this configuration, the bias current of the peak amplifier is controlled in accordance with output power, and thereby improved AM-AM characteristics can be obtained compared with a typical Doherty amplifier.

However, in the Doherty amplifier disclosed in U.S. Patent Application Publication No. 2016/0241209, an input signal supplied to the base of the carrier amplifier includes alternating current (AC) components, and thus a detection signal obtained by detecting a base current of the carrier amplifier may include AC components. In this case, the bias circuit of the peak amplifier is controlled by the detection signal including the AC components. Therefore, supply of a bias current to the peak amplifier may become unstable, resulting in degradation of characteristics of output power, such as harmonic distortion.

BRIEF SUMMARY

The present disclosure has been made in view of the above-described circumstances, and the present disclosure provides a power amplifier circuit in which AM-AM characteristics are improved and harmonic distortion is suppressed.

According to preferred embodiments of the present disclosure, a power amplifier circuit includes a Doherty amplifier including a divider that divides a first signal into a second signal and a third signal, a carrier amplifier that amplifies the second signal and outputs a fourth signal, a peak amplifier that amplifies the third signal and outputs a fifth signal, a combiner that combines the fourth signal and the fifth signal and outputs an amplified signal of the first signal, a first bias circuit that supplies a first bias current or voltage to the carrier amplifier, and a second bias circuit that supplies a second bias current or voltage corresponding to a control signal to the peak amplifier; and a control circuit that supplies the control signal corresponding to a level of the second signal to the second bias circuit, the control circuit including a detecting unit that outputs a detection signal corresponding to the level of the second signal, an output unit that outputs the control signal corresponding to the detection signal, and a filter circuit that attenuates alternating current (AC) components of the detection signal or AC components of the control signal.

According to preferred embodiments of the present disclosure, a power amplifier circuit includes a Doherty amplifier including a divider that divides a first signal into a second signal and a third signal, a carrier amplifier including a first transistor that amplifies the second signal and outputs a fourth signal, a peak amplifier including a second transistor that amplifies the third signal and outputs a fifth signal, a combiner that combines the fourth signal and the fifth signal and outputs an amplified signal of the first signal, a first bias circuit that supplies a first bias current or voltage to a base of the first transistor, and a second bias circuit that supplies a second bias current or voltage corresponding to a control signal to a base of the second transistor; a third transistor that is connected in parallel to the first transistor and outputs a sixth signal corresponding to a level of the fourth signal; and a control circuit that supplies the control signal corresponding to the sixth signal to the second bias circuit.

According to preferred embodiments of the present disclosure, a power amplifier circuit includes a Doherty amplifier including a divider that divides a first signal into a second signal and a third signal, a carrier amplifier that amplifies the second signal and outputs a fourth signal, a peak amplifier that amplifies the third signal and outputs a fifth signal, a combiner that combines the fourth signal and the fifth signal and outputs an amplified signal of the first signal, a first bias circuit that supplies a first bias current or voltage to the carrier amplifier, and a second bias circuit that supplies a second bias current or voltage corresponding to a control signal to the peak amplifier; an amplifier that amplifies an input signal and outputs the first signal; a third bias circuit that supplies a third bias current or voltage to the amplifier; and a control circuit that supplies the control signal corresponding to a level of the input signal to the second bias circuit.

According to preferred embodiments of the present disclosure, there is provided a power amplifier circuit in which AM-AM characteristics are improved and harmonic distortion is suppressed.

Other features, elements, characteristics and advantages of the present disclosure will become more apparent from the following detailed description of preferred embodiments of the present disclosure with reference to the attached drawings.

DETAILED DESCRIPTION

Figure 1:
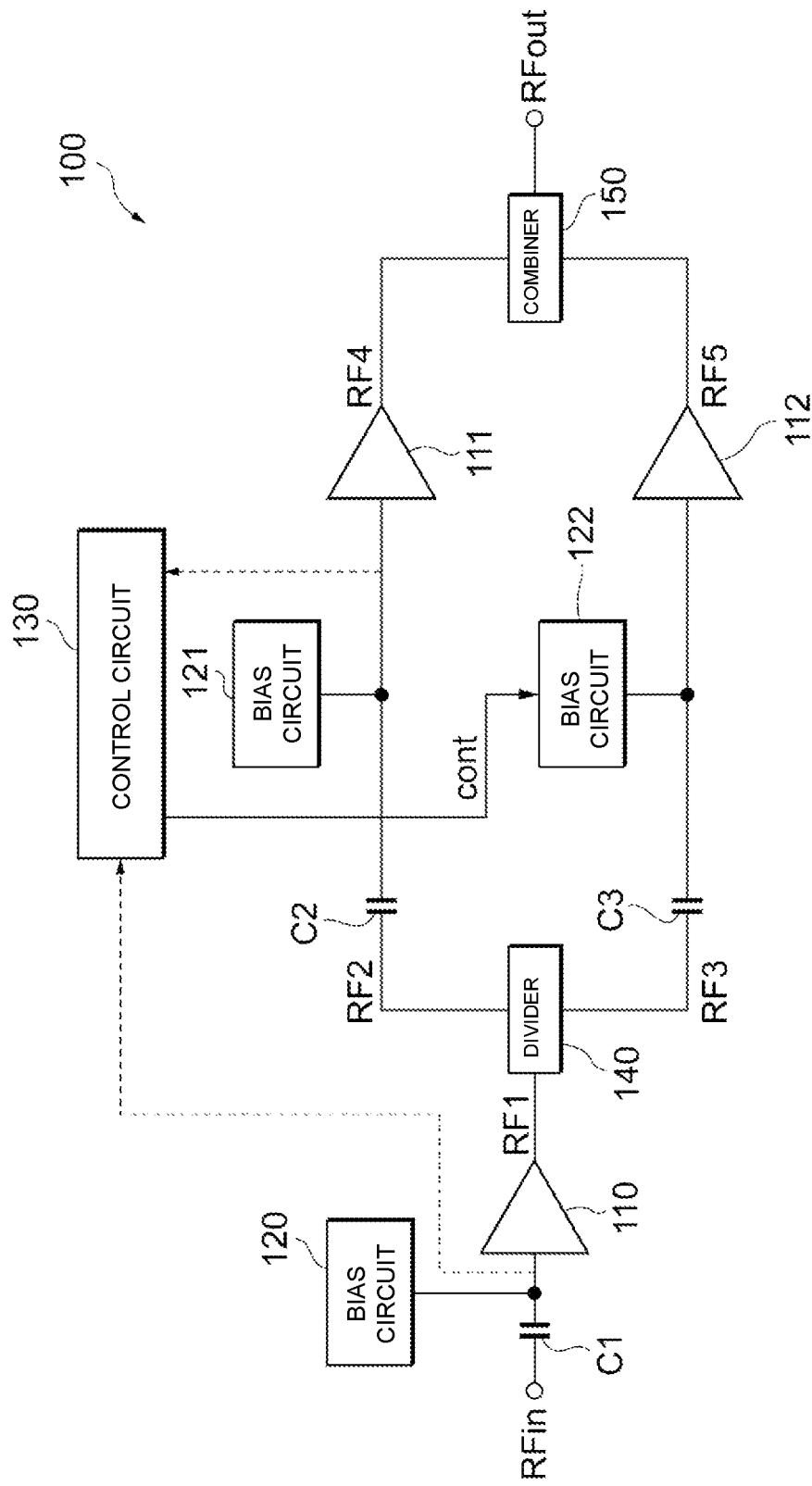
FIG. 1 is a conceptual diagram illustrating an example configuration of a power amplifier circuit according to a first embodiment of the present disclosure.

Hereinafter, embodiments of the present disclosure will be described in detail with reference to the drawings. In the embodiments, the elements identical to each other are denoted by the same reference numerals, and the same description will not be repeated.

FIG. 1 is a conceptual diagram illustrating an example configuration of a power amplifier circuit according to a first embodiment of the present disclosure. A power amplifier circuit 100 illustrated in FIG. 1 is mounted in, for example, a mobile communication device, such as a cellular phone, and is used to amplify the power of a radio frequency (RF) signal that is to be transmitted to a base station. The power amplifier circuit 100 amplifies the power of a signal conforming to communication standards, for example, second-generation mobile communication system (2G), third-generation mobile communication system (3G), fourth-generation mobile communication system (4G), fifth-generation mobile communication system (5G), Long Term Evolution-Frequency Division Duplex (LTE-FDD), Long Term Evolution-Time Division Duplex (LTE-TDD), LTE-Advanced, LTE-Advanced Pro, and the like. The frequency of the RF signal ranges, for example, from about several hundred MHz to about several GHz. Note that the communication standard and frequency of a signal amplified by the power amplifier circuit 100 are not limited to those described above.

The power amplifier circuit 100 includes, for example, a driver amplifier 110, a carrier amplifier 111, a peak amplifier 112, bias circuits 120 to 122, a control circuit 130, a divider 140, a combiner 150, and capacitors C1 to C3. FIG. 1 illustrates a configuration in which the power of an RF signal is amplified in two stages by an amplifier in an anterior stage (driver amplifier 110) and amplifiers in a posterior stage (carrier amplifier 111 and peak amplifier 112). However, the number of stages may be one or may be three or more. Hereinafter the individual elements will be described in detail.

The driver amplifier 110 and the bias circuit 120 constitute an amplifier circuit in the anterior stage that amplifies an input signal RFin input to the power amplifier circuit 100.

The driver amplifier 110 amplifies the input signal RFin input thereto through the capacitor C1 and outputs an amplified signal RF1 (first signal). The amplified signal RF1 is supplied to the divider 140. The driver amplifier 110 is not particularly limited and may be, for example, a bipolar transistor such as a heterojunction bipolar transistor (HBT), a field-effect transistor (metal-oxide-semiconductor field-effect transistor (MOSFET)), or the like. The same applies to the carrier amplifier 111 and the peak amplifier 112, which will be described below.

The bias circuit 120 (third bias circuit) supplies a bias current or voltage (third bias current or voltage) to the driver amplifier 110. In accordance with the bias current or voltage supplied from the bias circuit 120, the gain of the driver amplifier 110 is controlled.

The capacitor C1 is a coupling capacitor that interrupts direct current (DC) components superimposed on an input RF signal and allows only AC components to pass therethrough. The same applies to the capacitors C2 and C3.

The carrier amplifier 111, the peak amplifier 112, the bias circuits 121 and 122, the control circuit 130, the divider 140, and the combiner 150 constitute an amplifier circuit in the posterior stage that further amplifies the amplified signal RF1 output from the driver amplifier 110. The amplifier circuit in the posterior stage has a configuration similar to that of a typical Doherty amplifier.

The divider 140 divides the amplified signal RF1 into a signal RF2 (second signal) that is to be supplied to the carrier amplifier 111 and a signal RF3 (third signal) that is to be supplied to the peak amplifier 112. The divider 140 is formed of, for example, an inductor and a capacitor. The two signals RF2 and RF3 output from the divider 140 have a phase difference of about 90 degrees, for example.

The carrier amplifier 111 amplifies the signal RF2 (second signal) input thereto and outputs an amplified signal RF4 (fourth signal). The peak amplifier 112 amplifies the signal RF3 (third signal) input thereto and outputs an amplified signal RF5 (fifth signal). Here, the carrier amplifier 111 operates regardless of the power level of the input signal RFin. On the other hand, the peak amplifier 112 operates in a region where the power level of the input signal RFin is higher than or equal to a certain level (back-off point) that is lower than a maximum level by a certain value. That is, only the carrier amplifier 111 operates in a region where the power level of the input signal RFin is relatively low (a region where the power level of the input signal RFin is lower than the back-off point). In a region where the power level of the input signal RFin is relatively high (a region where the power level of the input signal RFin is higher than or equal to the back-off point), both the carrier amplifier 111 and the peak amplifier 112 operate. Accordingly, the Doherty amplifier, which includes the carrier amplifier 111 that operates while maintaining saturation at a saturation output power level or the vicinity thereof in a region where the power level of the input signal RFin is relatively high, achieves increased efficiency compared with a configuration including only one amplifier.

The bias circuit 121 (first bias circuit) supplies a bias current or voltage (first bias current or voltage) to the carrier amplifier 111. The bias circuit 122 (second bias circuit) supplies a bias current or voltage (second bias current or voltage) to the peak amplifier 112. The gains of the carrier amplifier 111 and the peak amplifier 112 are controlled in accordance with the bias current or voltage supplied from the bias circuit 121 and the bias current or voltage supplied from the bias circuit 122, respectively. For example, the carrier amplifier 111 may be biased in class-AB and the peak amplifier 112 may be biased in class-C.

The control circuit 130 detects the level of the signal RF2 that is to be supplied to the carrier amplifier 111 or the level of the input signal RFin (broken-line arrows in FIG. 1) and supplies a control signal cont corresponding to the level to the bias circuit 122 of the peak amplifier 112 (solid-line arrow in FIG. 1). Accordingly, the bias current or voltage that is to be supplied to the peak amplifier 112 can be adjusted in accordance with the saturation state of the carrier amplifier 111. Thus, AM-AM characteristics are improved compared with a typical Doherty amplifier. The detailed configurations of the bias circuits 121 and 122 and the control circuit 130 will be described below in individual embodiments.

The combiner 150 combines the amplified signal RF4 output from the carrier amplifier 111 and the amplified signal RF5 output from the peak amplifier 112 and outputs an amplified signal RFout. The combiner 150 also has a function of converting the phases of the amplified signals RF4 and RF5 and performing impedance matching for converting one or both of the output impedance of the carrier amplifier 111 and the output impedance of the peak amplifier 112. For example, in a case where the signals RF2 and RF3 have a phase difference of about 90 degrees, the phases of the amplified signals RF4 and RF5 are converted so that the phase difference therebetween becomes about zero degrees. Next, the control of the bias circuit 122 will be described in detail in individual embodiments.

Figure 2:
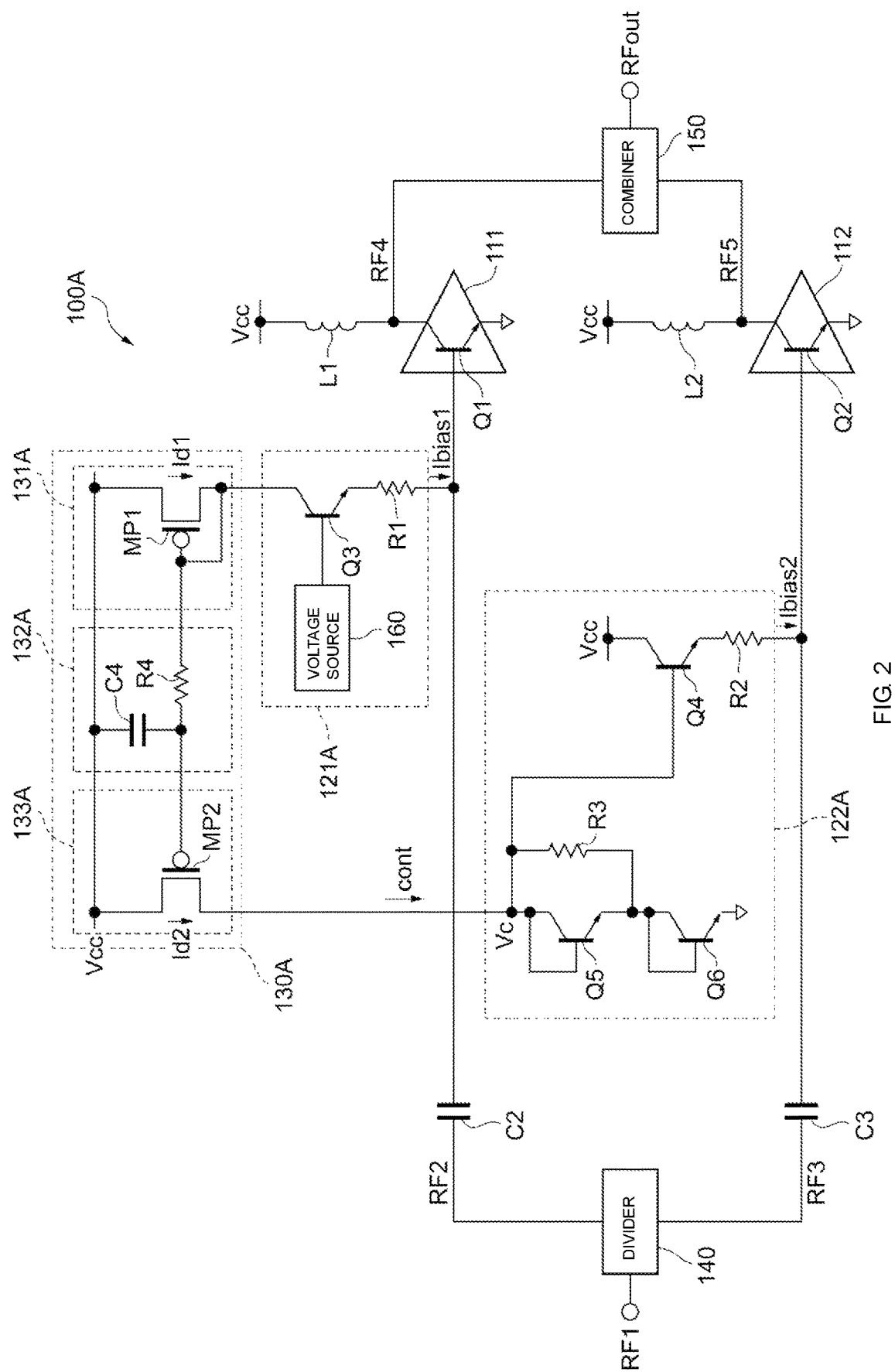
FIG. 2 is a circuit diagram illustrating an example configuration of the power amplifier circuit according to the first embodiment of the present disclosure.

FIG. 2 is a circuit diagram illustrating an example configuration of the power amplifier circuit according to the first embodiment of the present disclosure. Specifically, FIG. 2 is a diagram illustrating a specific example of the circuit configuration of the carrier amplifier 111, the peak amplifier 112, the bias circuits 121 and 122, and the control circuit 130 in the power amplifier circuit 100 illustrated in FIG. 1. In FIG. 2, the configuration of the stage from the divider 140 is illustrated, and the configuration of the amplifier in the anterior stage is not illustrated. Among the elements illustrated in FIG. 2, the elements corresponding to those illustrated in FIG. 1 are denoted by the same reference numerals and the description thereof will not be given.

A transistor Q1 (first transistor) is an HBT included in the carrier amplifier 111. A transistor Q2 (second transistor) is an HBT included in the peak amplifier 112. Specifically, the transistor Q1 includes a collector that is supplied with a power supply voltage Vcc through an inductor L1, a base that is supplied with the signal RF2 through the capacitor C2, and an emitter that is grounded. Similarly, the transistor Q2 includes a collector that is supplied with the power supply voltage Vcc through an inductor L2, a base that is supplied with the signal RF3 through the capacitor C3, and an emitter that is grounded. The inductors L1 and L2 are choke inductors that suppress leakage of a signal to a power supply circuit.

A bias circuit 121A (first bias circuit) supplies a predetermined bias current 'bias' to the base of the transistor Q1. Specifically, the bias circuit 121A includes, for example, a voltage source 160, a transistor Q3, and a resistor element R1.

The voltage source 160 generates a predetermined voltage and supplies the voltage to the base of the transistor Q3.

The transistor Q3 includes a collector that is supplied with the power supply voltage Vcc through a control circuit 130A and an emitter that is connected to the base of the transistor Q1 through the resistor element R1. Accordingly, in the bias circuit 121A, the bias current 'bias' is output from the emitter of the transistor Q3 and passes through the resistor element R1, and then the bias current 'bias' is supplied to the base of the transistor Q1. The resistor element R1 suppresses an increase in the bias current Ibias1, which may be caused by an increase in temperature of the transistor Q1.

The control circuit 130A includes, for example, a detecting unit 131A, a filter circuit 132A, and an output unit 133A.

The detecting unit 131A includes a P-channel MOSFET MP1 (first FET). The P-channel MOSFET MP1 includes a source that is supplied with the power supply voltage Vcc, a gate that is connected to a drain, and the drain that is connected to the collector of the transistor Q3 included in the bias circuit 121A. That is, the P-channel MOSFET MP1 is connected in series to the transistor Q3. Accordingly, a drain current Id1 (detection signal) of the P-channel MOSFET MP1 and the bias current 'bias' output from the transistor Q3 are identical in amount (Id1=Ibias1). In addition, the base current of the transistor Q1 varies with an increase in the power level of the signal RF2, and accordingly the amount of the bias current 'bias' (=Id1) increases. That is, the drain current Id1 of the P-channel MOSFET MP1 varies according to the power level of the signal RF2. Thus, the P-channel MOSFET MP1 functions as a detecting unit that detects the power level of the signal RF2.

The filter circuit 132A is, for example, a low pass filter including a capacitor C4 and a resistor element R4. The low pass filter has a cutoff frequency that is lower than the carrier frequency of an RF signal. Furthermore, in a case where the modulation scheme for the RF signal involves a change in envelope, the cutoff frequency is higher than the frequency of envelope components. The capacitor C4 includes one end that is supplied with the power supply voltage Vcc and the other end that is connected to a connection point between the gate of a P-channel MOSFET MP2 and one end of the resistor element R4. The resistor element R4 is connected in series between the gate of the P-channel MOSFET MP1 and the gate of the P-channel MOSFET MP2. The filter circuit 132A has the following function.

That is, the base current of the transistor Q1 varies according to the signal RF2 supplied to the base of the transistor Q1. In accordance with the variation of the base current of the transistor Q1, the bias current 'bias' output from the emitter of the transistor Q3 varies. That is, in accordance with the variation of the base current of the transistor Q1, the drain current Id1 of the P-channel MOSFET MP1 varies. Thus, the drain current Id1 of the P-channel MOSFET MP1 varies according to the signal RF2. Since the signal RF2 is an RF signal, the drain current Id1 includes AC components of a frequency around the carrier of the RF signal. Thus, if the control circuit 130A does not include the filter circuit 132A, the drain current Id1 including AC components is supplied to the output unit 133A, and a bias circuit 122A is controlled by a control signal cont including the AC components. Accordingly, the amount of a bias current Ibias2 supplied to the transistor Q2 varies, which may result in degradation of characteristics of the output power output from the combiner 150, such as harmonic distortion.

The filter circuit 132A supplies, to the output unit 133A, a signal obtained by attenuating the AC components included in the drain current Id1. This suppresses transmission of the AC components to the output unit 133A. The configuration of the filter circuit 132A is not limited thereto, and another configuration may be used as long as the AC components are attenuated. For example, the filter circuit 132A may be configured by combining a capacitor and an inductor.

The output unit 133A includes the P-channel MOSFET MP2 (second FET) that is connected to the P-channel MOSFET MP1 so as to form a current mirror. The P-channel MOSFET MP2 includes a source that is supplied with the power supply voltage Vcc, a gate that is connected to the gate of the P-channel MOSFET MP1, and a drain that is connected to the collector of a transistor Q5 included in the bias circuit 122A. Accordingly, a current (drain current Id2) proportional to the drain current Id1 of the P-channel MOSFET MP1 flows between the source and drain of the P-channel MOSFET MP2 (Id2∝Id1). As described above, the drain current Id1 of the P-channel MOSFET MP1 varies according to the power level of the signal RF2. Thus, the drain current Id2 of the P-channel MOSFET MP2 varies according to the power level of the signal RF2. The drain current Id2, which serves as a control signal cont for controlling the bias current Ibias2, is supplied to the bias circuit 122A.

In this way, the control circuit 130A detects the power level of the signal RF2 and supplies the drain current Id2 (control signal cont) corresponding to the detected power level to the bias circuit 122A.

The bias circuit 122A (second bias circuit) supplies, to the base of the transistor Q2, the bias current Ibias2 corresponding to the control signal cont supplied from the control circuit 130A. Specifically, the bias circuit 122A includes, for example, transistors Q4 to Q6 and resistor elements R2 and R3. The transistor Q5 includes a collector and a base connected to each other (hereinafter also referred to as "diode connection"), the collector being supplied with the control signal cont, and also includes an emitter that is connected to the collector of the transistor Q6. The transistor Q6 has a diode connection, the collector thereof is connected to the emitter of the transistor Q5, and the emitter thereof is grounded. Accordingly, a voltage Vc of a predetermined level (for example, about 2.6 V) is generated at the collector of the transistor Q5. The transistor Q4 and the resistor element R2 are similar to the transistor Q3 and the resistor element R1 in the bias circuit 121A, respectively, and thus the detailed description thereof is not given.

The resistor element R3 includes one end that is connected to the collector of the transistor Q5 and the other end that is connected to the emitter of the transistor Q5. Accordingly, the drain current Id2 supplied from the control circuit 130A flows through the resistor element R3 when the amount of the current is small, and flows through the transistor Q5 when the amount of the current increases. Thus, the collector voltage Vc of the transistor Q5 linearly rises in a region where the amount of the drain current Id2 is small, and logarithmically rises with an increase in the amount of the drain current Id2. Thus, in the bias circuit 122A, the rising of the collector voltage Vc is gradual compared with a configuration not including the resistor element R3. The bias circuit 122A generates the bias current Ibias2 corresponding to the value of the collector voltage Vc and supplies the generated bias current Ibias2 to the base of the transistor Q2.

With the above-described configuration of the power amplifier circuit 100A, when the power level of the signal RF2 increases, the drain current Id1 of the P-channel MOSFET MP1 increases, and accordingly the drain current Id2 of the P-channel MOSFET MP2 increases. As a result, the drain current Id2 supplied to the bias circuit 122A increases. That is, the amount of the bias current Ibias2 is controlled in accordance with the power level of the signal RF2. Thus, the operation state of the peak amplifier 112 can be controlled in accordance with the saturation state of the carrier amplifier 111, and the AM-AM characteristics can be improved. In addition, in the power amplifier circuit 100A, in which the control circuit 130A includes the filter circuit 132A, even if the power level of the signal RF2 is large and even if the drain current Id1 includes AC components, the AC components are attenuated and then the drain current Id1 is supplied to the output unit 133A. Thus, compared with the configuration disclosed in U.S. Patent Application Publication No. 2016/0241209, the amount of the bias current Ibias2 supplied to the peak amplifier 112 is stable, and degradation of characteristics of the output power, such as harmonic distortion, is suppressed.

Figure 3:
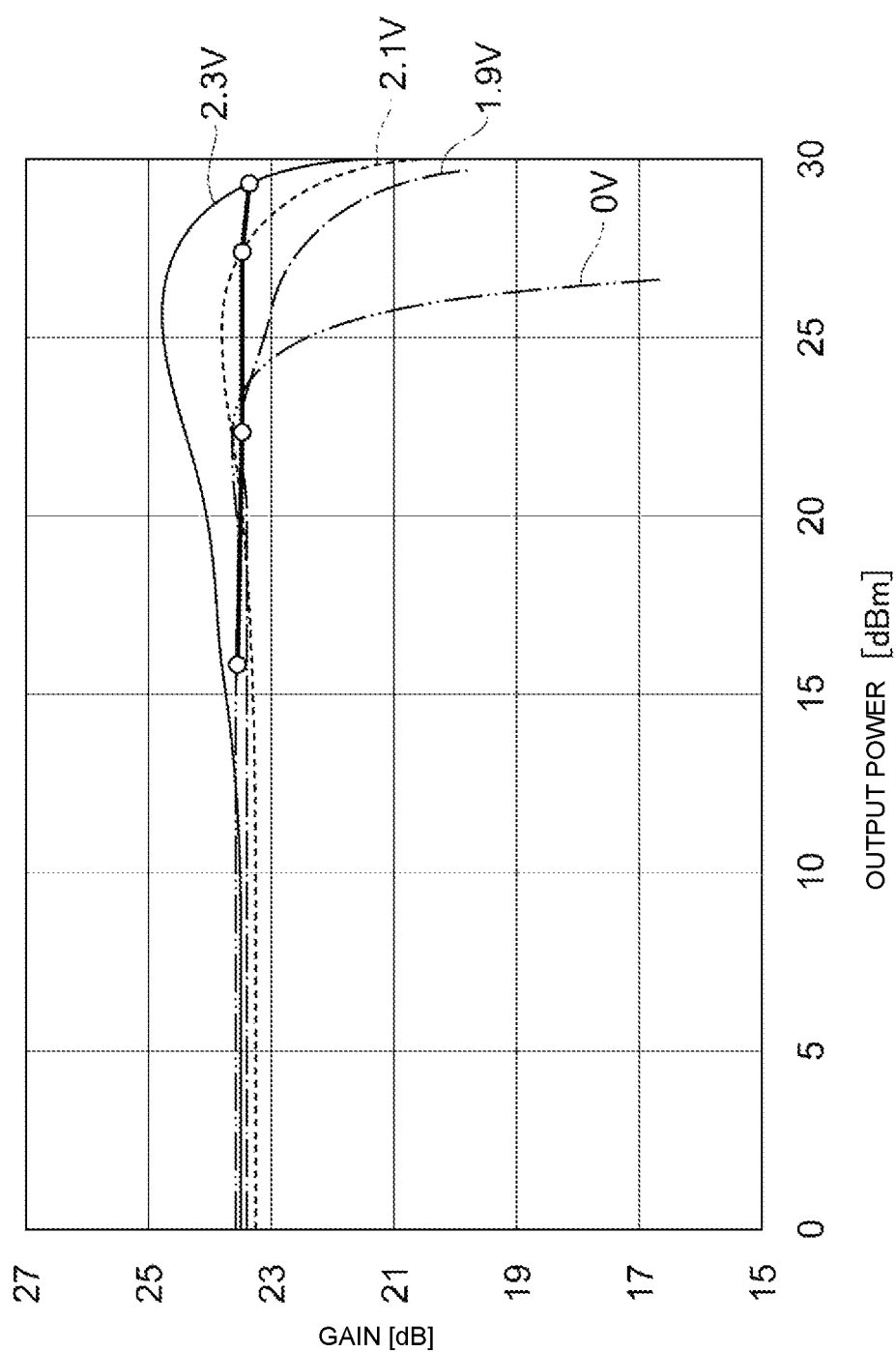
FIG. 3 is a diagram illustrating AM-AM characteristics in a case where the bias voltage of a peak amplifier is changed in a typical Doherty amplifier.

FIG. 3 is a diagram illustrating AM-AM characteristics in a case where the bias voltage of a peak amplifier is changed in a typical Doherty amplifier. Specifically, FIG. 3 illustrates AM-AM characteristics in a case where the bias voltage of the peak amplifier in the Doherty amplifier is set to 0 V, 1.9 V, 2.1 V, and 2.3 V. In the graph illustrated in FIG. 3, the vertical axis represents gain (dB) and the horizontal axis represents output power (dBm).

As illustrated in FIG. 3, when the bias voltage of the peak amplifier is fixed to 0 V or 1.9 V, the gain decreases as the output power increases. On the other hand, when the bias voltage is fixed to 2.1 V or 2.3 V, the gain increases and then decreases as the output power increases. Thus, it is understood that, when the bias voltage is changed in accordance with the level of the output power, the entire Doherty amplifier exhibits the AM-AM characteristics represented by the circles connected to each other in FIG. 3, and the linearity of the gain increases. Accordingly, it is understood that the AM-AM characteristics are improved by controlling the bias current Ibias2 of the peak amplifier 112 in accordance with the power level of the signal RF2 in the power amplifier circuit 100A.

Figure 4:
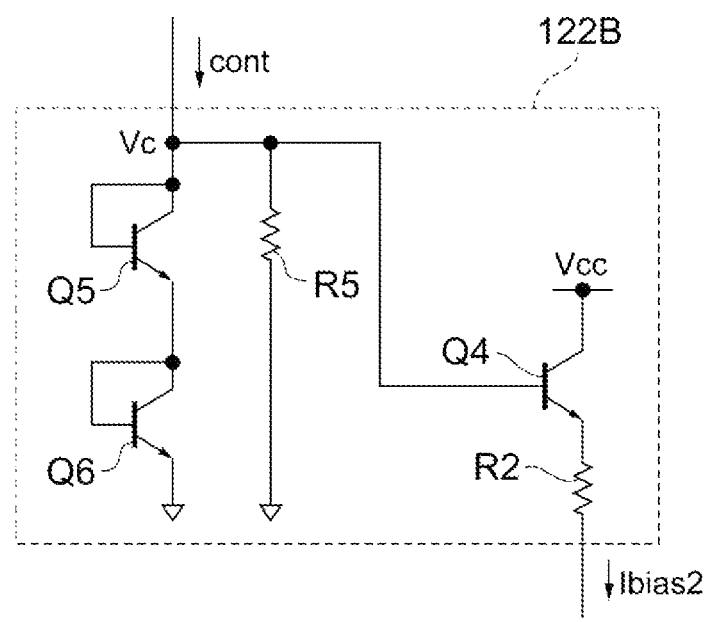
FIG. 4 is a circuit diagram illustrating a modification of a bias circuit.

FIG. 4 is a circuit diagram illustrating a modification of the bias circuit 122. The bias circuit 122B illustrated in FIG. 4 is different from the bias circuit 122A illustrated in FIG. 2 in that the bias circuit 122B includes a resistor element R5 instead of the resistor element R3.

The resistor element R5 includes one end that is connected to the collector of the transistor Q5 and the other end that is connected to the ground. Accordingly, compared with the configuration illustrated in FIG. 2 in which the resistor element R3 is connected between the collector and emitter of the transistor Q5 and in which the range of change in the voltage Vc corresponds to the base-emitter voltage of one transistor, the range of change in the voltage Vc corresponds to the base-emitter voltages of two transistors. As a result, the control range of the bias current Ibias2 is widened.

Figure 5:
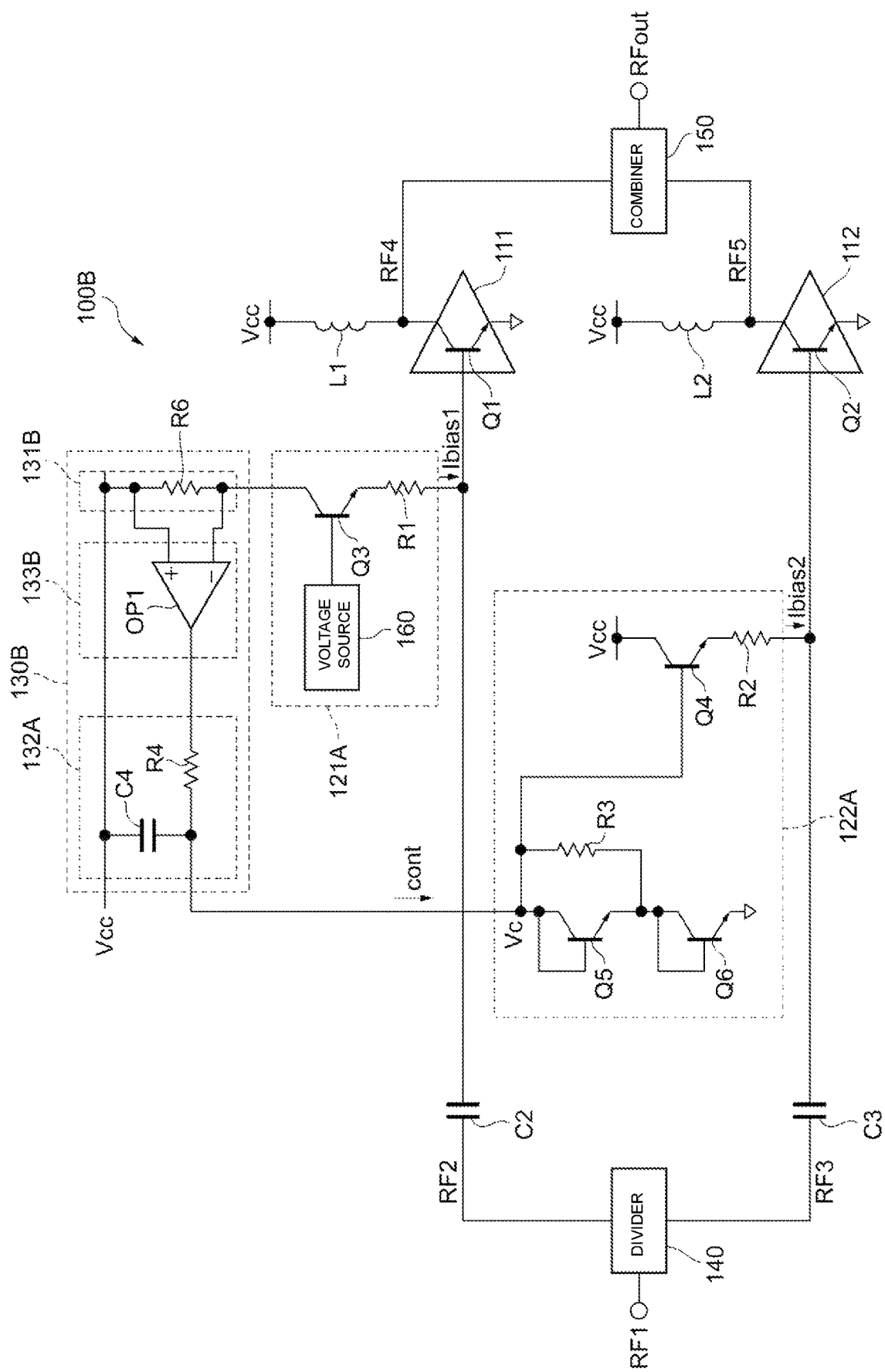
FIG. 5 is a circuit diagram illustrating an example configuration of a power amplifier circuit according to a modification of the first embodiment of the present disclosure.

FIG. 5 is a circuit diagram illustrating an example configuration of a power amplifier circuit according to a modification of the first embodiment of the present disclosure. The power amplifier circuit 100B illustrated in FIG. 5 is different from the power amplifier circuit 100A in the configurations of the detecting unit and the output unit of the control circuit. Specifically, the control circuit 130B illustrated in FIG. 5 includes a detecting unit 131B and an output unit 133B.

The detecting unit 131B includes a resistor element R6. The resistor element R6 includes one end that is supplied with the power supply voltage Vcc and the other end that is connected to the collector of the transistor Q3. Accordingly, the same amount of current as the bias current 'bias' flows through the resistor element R6. Thus, when the bias current 'bias' increases with an increase in the power level of the signal RF2, voltage drop in the resistor element R6 becomes large, and the voltage difference between one end and the other end of the resistor element R6 becomes large.

The output unit 133B includes an operational amplifier OP1. The operational amplifier OP1 includes a non-inverting input terminal that is supplied with a voltage at one end of the resistor element R6 and an inverting input terminal that is supplied with a voltage at the other end of the resistor element R6. Accordingly, the operational amplifier OP1 outputs, from its output terminal, a voltage (control signal) proportional to the voltage difference in the resistor element R6. That is, the voltage output from the operational amplifier OP1 has a value proportional to the amount of the bias current Ibias1.

In this way, the control circuit 130B is capable of supplying the bias circuit 122A with a voltage corresponding to the bias current Ibias1. The filter circuit 132A attenuates AC components included in the output voltage of the operational amplifier OP1.

Also with the above-described configuration, the bias circuit 122A supplies the base of the transistor Q2 with the bias current Ibias2 corresponding to the control signal cont supplied from the control circuit 130B. Thus, the power amplifier circuit 100B is capable of producing an effect similar to the effect of the power amplifier circuit 100A. In this way, the bias circuit 122A may be controlled by a current as in the power amplifier circuit 100A or may be controlled by a voltage as in the power amplifier circuit 100B.

Also in the power amplifier circuit 100B, the configuration of the bias circuit 122B illustrated in FIG. 4 may be applied instead of the bias circuit 122A.

Figure 6:
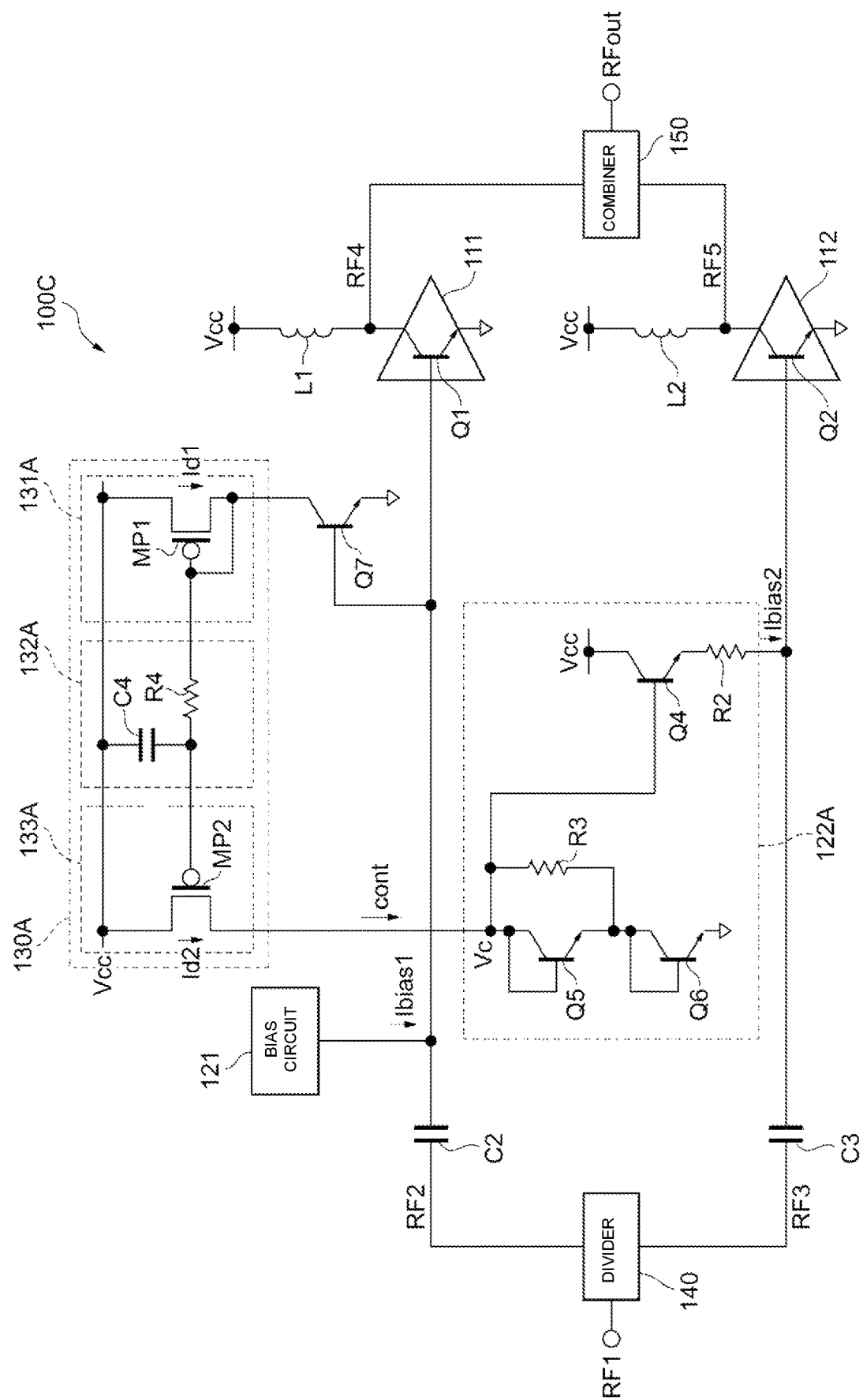
FIG. 6 is a circuit diagram illustrating an example configuration of a power amplifier circuit according to a second embodiment of the present disclosure.

FIG. 6 is a circuit diagram illustrating an example configuration of a power amplifier circuit according to a second embodiment of the present disclosure. The power amplifier circuit 100C illustrated in FIG. 6 is different from the power amplifier circuit 100A in the target detected by the detecting unit 131A. Specifically, the power amplifier circuit 100C further includes a transistor Q7 for detecting the power level of the signal RF2.

The transistor Q7 (third transistor) is connected in parallel to the transistor Q1 included in the carrier amplifier 111. Specifically, the transistor Q7 includes a collector that is connected to the drain of the P-channel MOSFET MP1, a base that is supplied with the signal RF2 that has passed through the capacitor C2 and the bias current Ibias1, and an emitter that is grounded. The transistor Q7 is, for example, a transistor having characteristics similar to those of the transistor Q1 and having a size smaller than the transistor Q1. Accordingly, the transistor Q7 outputs a current (sixth signal) corresponding to the level of the amplified signal RF4 output from the transistor Q1. More specifically, the transistor Q7 outputs, for example, a current proportional to the output current of the transistor Q1. That is, the transistor Q7 has a function of duplicating the transistor Q1.

Between the source and drain of the P-channel MOSFET MP1 included in the detecting unit 131A, the same amount of current (detection signal) as the current flowing through the transistor Q7 flows. Thus, the detecting unit 131A is capable of detecting the power level of the signal RF2 by using the drain current Id1. The operations of the filter circuit 132A and the output unit 133A are the same as those in the power amplifier circuit 100A, and thus the detailed description thereof is not given.

Also with the above-described configuration of the power amplifier circuit 100C, the amount of the drain current Id2 supplied to the bias circuit 122A is controlled in accordance with the power level of the signal RF2. Thus, the power amplifier circuit 100C is capable of producing an effect similar to the effect of the power amplifier circuit 100A. In addition, in the power amplifier circuit 100C, an output current of the transistor Q7, which is smaller in size than the transistor Q1, is detected. Accordingly, compared with the configuration in which the base current of the transistor Q1 is detected, AC components included in the drain current Id1 are suppressed. Thus, in the power amplifier circuit 100C, the control circuit 130A does not need to include the filter circuit 132A.

Also in the power amplifier circuit 100C, the configuration of the bias circuit 122B illustrated in FIG. 4 may be applied instead of the bias circuit 122A. In addition, the configuration of the control circuit 130B illustrated in FIG. 5 may be applied instead of the control circuit 130A.

Figure 7:
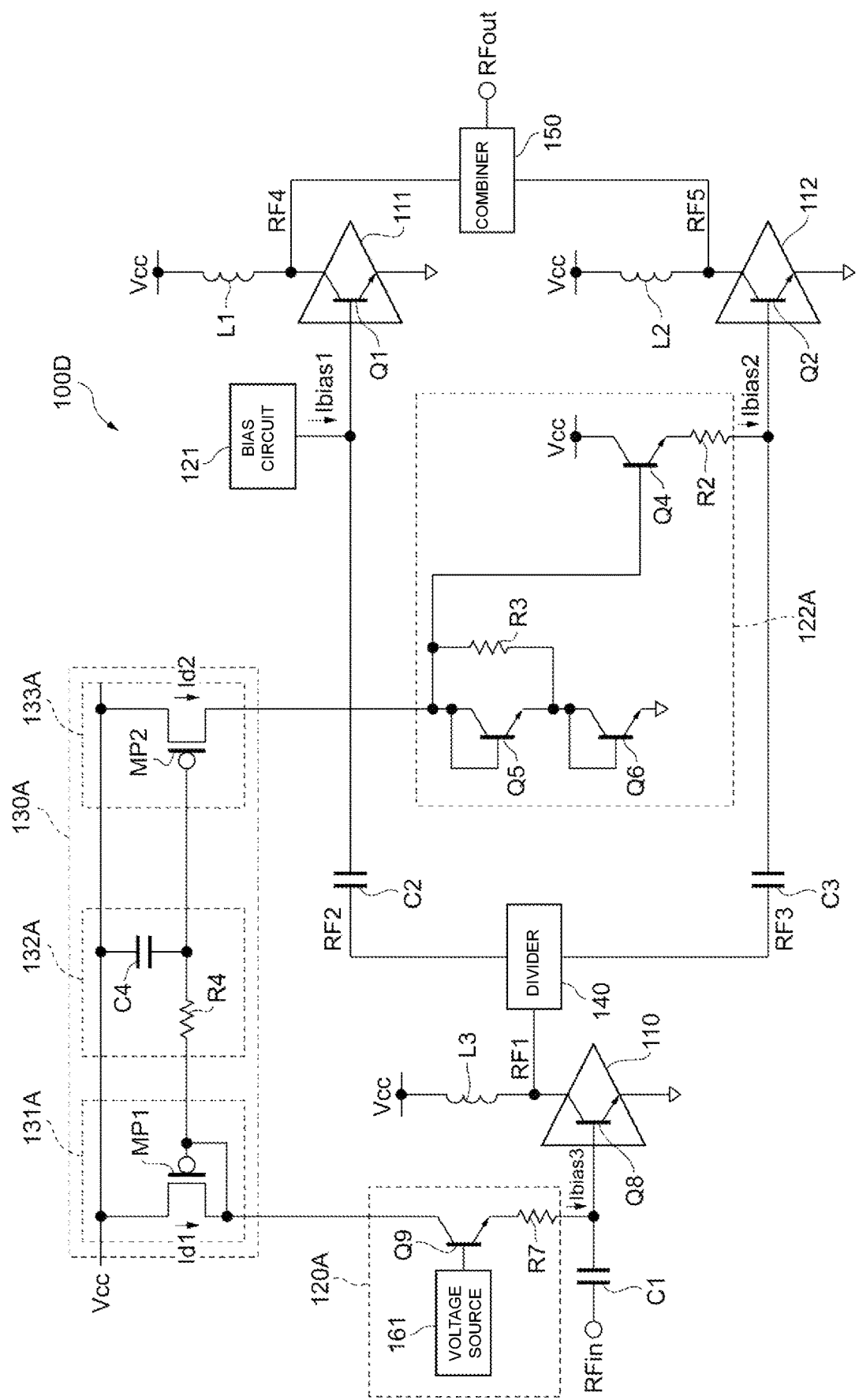
FIG. 7 is a circuit diagram illustrating an example configuration of a power amplifier circuit according to a third embodiment of the present disclosure.

FIG. 7 is a circuit diagram illustrating an example configuration of a power amplifier circuit according to a third embodiment of the present disclosure. The power amplifier circuit 100D illustrated in FIG. 7 is different from the power amplifier circuits 100A and 100B in the target detected by the detecting unit 131A. Specifically, in the power amplifier circuit 100D, the detecting unit 131A detects a bias current Ibias3 that is to be supplied to the driver amplifier 110.

The driver amplifier 110 includes a transistor Q8. Specifically, the transistor Q8 includes a collector that is supplied with the power supply voltage Vcc through an inductor L3, a base that is supplied with the input signal RFin through the capacitor C1, and an emitter that is grounded. In addition, the base of the transistor Q8 is supplied with the bias current Ibias3 (third bias current) from a bias circuit 120A.

The bias circuit 120A (third bias circuit) includes, for example, a voltage source 161, a transistor Q9, and a resistor element R7. The functions of the voltage source 161, the transistor Q9, and the resistor element R7 are similar to those of the voltage source 160, the transistor Q3, and the resistor element R1 in the bias circuit 121A illustrated in FIG. 2, and thus the detailed description thereof is not given.

In this embodiment, the detecting unit 131A detects the amount of the bias current Ibias3 that flows through the bias current 120A. Specifically, the P-channel MOSFET MP1 is connected in series to the transistor Q9 that outputs the bias current Ibias3. Accordingly, between the source and drain of the P-channel MOSFET MP1, the same amount of current as the bias current Ibias3 output from the transistor Q9 flows. In addition, as the power level of the input signal RFin increases, the base current of the transistor Q8 varies, and accordingly the amount of the bias current Ibias3 (=Id1) increases. Thus, the detecting unit 131A is capable of detecting the power level of the input signal RFin by using the drain current Id1. The operations of the filter circuit 132A and the output unit 133A are the same as those in the power amplifier circuit 100A, and thus the detailed description thereof is not given.

Also with the above-described configuration of the power amplifier circuit 100D, the amount of the drain current Id2 supplied to the bias circuit 122A is controlled in accordance with the power level of the input signal RFin. Thus, the power amplifier circuit 100D is capable of producing an effect similar to the effect of the power amplifier circuit 100A. In addition, in the power amplifier circuit 100D, the base current of the transistor Q8 in the anterior stage is detected, and thus the power level of a signal as a target to be detected is low compared with the configuration in which the base current of the transistor Q1 in the posterior stage is detected. Accordingly, the AC components included in the drain current Id1 are suppressed. Thus, in the power amplifier circuit 100D, the control circuit 130A does not need to include the filter circuit 132A.

Also in the power amplifier circuit 100D, the configuration of the bias circuit 122B illustrated in FIG. 4 may be applied instead of the bias circuit 122A. In addition, the configuration of the control circuit 130B illustrated in FIG. 5 may be applied instead of the control circuit 130A.

Exemplary embodiments of the present disclosure have been described above. The power amplifier circuits 100A and 100B, each includes a Doherty amplifier and the control circuit 130, the Doherty amplifier including the carrier amplifier 111 that amplifies the signal RF2 and outputs the amplified signal RF4, the peak amplifier 112 that amplifies the signal RF3 and outputs the amplified signal RF5, the bias circuit 121 that supplies a bias current or voltage to the carrier amplifier 111, and the bias circuit 122 that supplies a bias current or voltage to the peak amplifier 112. The control circuits 130A and 130B respectively include the detecting units 131A and 131B that output a detection signal corresponding to the level of the signal RF2, the output units 133A and 133B that output a control signal corresponding to the detection signal to the bias circuit 122, and the filter circuit 132A that attenuates AC components of the detection signal or control signal. Accordingly, in the power amplifier circuits 100A and 100B, the amount of the bias current Ibias2 is controlled in accordance with the power level of the signal RF2. Thus, the operation state of the peak amplifier 112 is controlled in accordance with the saturation state of the carrier amplifier 111, and thus the AM-AM characteristics can be improved. In addition, in the power amplifier circuits 100A and 100B, the control circuits 130A and 130B, each includes the filter circuit 132A, and thus a detection signal or control signal including attenuated AC components is supplied to the bias circuit 122. Accordingly, the bias current Ibias2 supplied to the peak amplifier 112 is stable, and degradation of characteristics of the output power, such as harmonic distortion, is suppressed.

In the power amplifier circuits 100A, 100C, and 100D, the control circuit 130A includes the P-channel MOSFETs MP1 and MP2 connected to each other so as to form a current mirror, and the filter circuit 132A. Accordingly, output of a detection signal and generation of a control signal corresponding to the detection signal can be performed.

In the power amplifier circuits 100A, 100C, and 100D, the configuration of the filter circuit 132A is not particularly limited. For example, the filter circuit 132A may include the resistor element R4, which is connected in series between the gate of the P-channel MOSFET MP1 and the gate of the P-channel MOSFET MP2, and the capacitor C4, which includes one end supplied with the power supply voltage Vcc and the other end connected to one end of the resistor element R4.

The power amplifier circuit 100C includes the transistor Q7 that is connected in parallel to the transistor Q1 included in the carrier amplifier 111, and the detecting unit 131A detects a signal output from the transistor Q7. Accordingly, in the power amplifier circuit 100C, the amount of the bias current Ibias2 is controlled in accordance with the power level of the signal RF2. Thus, the operation state of the peak amplifier 112 is controlled in accordance with the saturation state of the carrier amplifier 111, and thus the AM-AM characteristics can be improved. In addition, in the power amplifier circuit 100C, the output current of the transistor Q7, which is a duplicate of the transistor Q1, is detected, and thus AC components included in a detection signal are suppressed compared with the configuration in which the base current of the transistor Q1 is detected.

The power amplifier circuit 100D includes the driver amplifier 110, and the detecting unit 131A detects a detection signal corresponding to the input signal RFin input to the driver amplifier 110. Accordingly, in the power amplifier circuit 100D, the amount of the bias current Ibias2 is controlled in accordance with the power level of the input signal RFin. Thus, the operation state of the peak amplifier 112 is controlled in accordance with the saturation state of the carrier amplifier 111, and thus the AM-AM characteristics can be improved. In addition, in the power amplifier circuit 100D, the base current of the driver amplifier 110 in the anterior stage is detected, and thus the power level of a signal as a target to be detected is low compared with the configuration in which the base current of the transistor Q1 in the posterior stage is detected. Accordingly, the AC components included in the detection signal are suppressed.

In the configurations according to the above-described embodiments and modifications, the level of the input signal RFin or the signal RF2 is detected by using a base current or collector current of the transistor that is supplied with the signal. However, the detection target of the level of the signal is not limited to a current. Alternatively, a voltage level or a power level may be detected.

The embodiments described above are for facilitating understanding of the present disclosure and are not for limiting the scope of the present disclosure. The present disclosure may be modified or improved without deviating from the gist thereof, and includes its equivalents. In other words, an embodiment implemented by appropriately changing the design of the individual embodiments by those skilled in the art is included in the scope of the present disclosure as long as the embodiment has a feature of the present disclosure. For example, the elements included in the individual embodiments, and the arrangement, materials, conditions, shapes, sizes, and so forth of the elements are not limited to those described above and may be changed as appropriate. The above-described embodiments are merely examples, and of course the configurations in different embodiments may be partially replaced or combined. An embodiment implemented through the replacement or combining is included in the scope of the present disclosure as long as the embodiment has a feature of the present disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:
1. A power amplifier circuit comprising:
 a Doherty amplifier comprising:
  a divider circuit configured to divide a first signal into a second signal and a third signal,
  a carrier amplifier configured to amplify the second signal and to output a fourth signal,
  a peak amplifier configured to amplify the third signal and to output a fifth signal,
  a combiner circuit configured to combine the fourth signal and the fifth signal and to output an amplified signal of the first signal,
  a first bias circuit configured to supply a first bias current or a first bias voltage to the carrier amplifier, and
  a second bias circuit configured to supply a second bias current or a second bias voltage to the peak amplifier, the second bias current or the second bias voltage corresponding to a control signal; and
 a control circuit configured to supply the control signal to the second bias circuit, the control signal corresponding to a level of the second signal, the control circuit comprising:
  a detecting circuit configured to output a detection signal corresponding to the level of the second signal,
  an output circuit configured to output the control signal corresponding to the detection signal, and
  a filter circuit configured to attenuate alternating current (AC) components of the detection signal or AC components of the control signal,
wherein:
 the first bias circuit comprises a transistor that outputs the first bias current,
 the detecting circuit comprises a first field-effect transistor (FET) that is connected in series with the transistor, the output circuit comprises a second FET that is connected to the first FET so as to form a current mirror and that outputs the control signal, and the filter circuit is disposed between a gate of the first FET and a gate of the second FET.

2. The power amplifier circuit according to claim 1, wherein the filter circuit comprises:
a resistor element that is connected in series between the gate of the first FET and the gate of the second FET, and
a capacitor including one end that is supplied with a power supply voltage and another end that is connected to one end of the resistor element.

3. A power amplifier circuit comprising:
a Doherty amplifier comprises:
a divider circuit configured to divide a first signal into a second signal and a third signal,
a carrier amplifier comprising a first transistor that amplifies the second signal and outputs a fourth signal,
a peak amplifier comprising a second transistor that amplifies the third signal and outputs a fifth signal,
a combiner circuit configured to combine the fourth signal and the fifth signal and to output an amplified signal of the first signal,
a first bias circuit configured to supply a first bias current or a first bias voltage to a base of the first transistor, and
a second bias circuit configured to supply a second bias current or a second bias voltage to a base of the second transistor, the second bias current or the second bias voltage corresponding to a control signal;
a third transistor that is connected in parallel with the first transistor and that outputs a sixth signal corresponding to a level of the fourth signal; and
a control circuit configured to supply the control signal to the second bias circuit, the control signal corresponding to the sixth signal.

4. The power amplifier circuit according to claim 3, wherein the control circuit comprises:
a first field-effect transistor (FET) that is connected in series with the third transistor and that outputs a detection signal corresponding to a level of the sixth signal,
a second FET that is connected to the first FET so as to form a current mirror and that outputs the control signal corresponding to the detection signal, and
a filter circuit that is disposed between a gate of the first FET and a gate of the second FET and that is configured to attenuate alternating current (AC) components of the detection signal.

5. The power amplifier circuit according to claim 4, wherein the filter circuit comprises:
a resistor element that is connected in series between the gate of the first FET and the gate of the second FET, and
a capacitor including one end that is supplied with a power supply voltage and another end that is connected to one end of the resistor element.

6. A power amplifier circuit comprising:
a Doherty amplifier comprising:
a divider circuit configured to divide a first signal into a second signal and a third signal,
a carrier amplifier configured to amplify the second signal and to output a fourth signal,
a peak amplifier configured to amplify the third signal and to output a fifth signal,
a combiner circuit configured to combine the fourth signal and the fifth signal and to output an amplified signal of the first signal,
a first bias circuit configured to supply a first bias current or a first bias voltage to the carrier amplifier, and
a second bias circuit configured to supply a second bias current or a second bias voltage to the peak amplifier, the second bias current or the second bias voltage corresponding to a control signal;
an amplifier configured to amplify an input signal and to output the first signal;
a third bias circuit configured to supply a third bias current or a third bias voltage to the amplifier; and
a control circuit configured to supply the control signal to the second bias circuit, the control signal corresponding to a level of the input signal.

7. The power amplifier circuit according to claim 6, wherein:
the third bias circuit comprises a transistor that outputs the third bias current, and
the control circuit comprises:
a first field-effect transistor (FET) that is connected in series with the transistor and that outputs a detection signal corresponding to the level of the input signal,
a second FET that is connected to the first FET so as to form a current mirror and that outputs the control signal corresponding to the detection signal, and
a filter circuit that is disposed between a gate of the first FET and a gate of the second FET and that is configured to attenuate alternating current (AC) components of the detection signal.

8. The power amplifier circuit according to claim 7, wherein the filter circuit comprises:
a resistor element that is connected in series between the gate of the first FET and the gate of the second FET, and
a capacitor including one end that is supplied with a power supply voltage and another end that is connected to one end of the resistor element.

9. The Power amplifier circuit according to claim 1, wherein the Doherty amplifier is configured to amplify signals conforming to a third-generation mobile communication system (3G), a fourth-generation mobile communication system (4G), or a fifth-generation mobile communication system (5G).

10. The Power amplifier circuit according to claim 3, wherein the Doherty amplifier is configured to amplify signals conforming to a third-generation mobile communication system (3G), a fourth-generation mobile communication system (4G), or a fifth-generation mobile communication system (5G).

11. The Power amplifier circuit according to claim 6, wherein the Doherty amplifier is configured to amplify signals conforming to a third-generation mobile communication system (3G), a fourth-generation mobile communication system (4G), or a fifth-generation mobile communication system (5G).

* * * * *